United States Patent [19]

Suzuki

[11] Patent Number: 5,060,272
[45] Date of Patent: Oct. 22, 1991

[54] AUDIO MIXING CONSOLE

[75] Inventor: Takashi Suzuki, Hamamatsu, Japan

[73] Assignee: Yamahan Corporation, Hamamatsu, Japan

[21] Appl. No.: 595,539

[22] Filed: Oct. 11, 1990

[30] Foreign Application Priority Data

Oct. 13, 1989 [JP] Japan .................. 1-267272

[51] Int. Cl.⁵ .............................................. H03G 3/00
[52] U.S. Cl. .................... 381/119; 381/107; 381/109
[58] Field of Search ................ 381/119, 109, 98, 107; 84/625, 345, 615, 622

[56] References Cited

U.S. PATENT DOCUMENTS

| | | | |
|---|---|---|---|
| 4,320,255 | 3/1982 | Null et al. | 381/109 |
| 4,402,246 | 9/1983 | Sekiguchi | 84/622 |
| 4,461,026 | 7/1984 | Priniski | 381/98 |
| 4,479,240 | 10/1984 | McKinley, Jr. | 381/109 |
| 4,706,294 | 11/1987 | Ouchida | 381/109 |

FOREIGN PATENT DOCUMENTS 0140508 6/1987 Japan .................. 381/104

Primary Examiner—Jin F. Ng
Assistant Examiner—Sylvia Chen
Attorney, Agent, or Firm—Spensley Horn Jubas & Lubitz

[57] ABSTRACT

An audio mixing console used in a recording studio etc. includes operators which can be driven both manually and by a motor, function selection switches for selecting one of a fader function and other functions in respective channels as a function to be designated by each of the operators, a display for displaying contents of separation assigned to the operators in accordance with selection by the function selection switches, a memory for storing operation positions of the operators for each of the functions, a control unit for reading out operation position information stored in the memory with respect to the function selected by the function selection switches and positioning the operators to the position by motor driving, and a signal processing circuit for applying to an input signal a signal processing corresponding to the position of the operators with respect to the function selected by the function selection switches. The operators can be used for functions other than fader functions, so that the construction of the mixing console can be simplified and the operation can be facilitated.

2 Claims, 5 Drawing Sheets

LoF LoG LQ MdF MdG MdQ HiF HiG — 34

FIG. 5

RT ID Hi Type — 34

FIG. 6

ATT F G Q Send1 Send2 Pan Fader — 34

AUDIO MIXING CONSOLE

BACKGROUND OF THE INVENTION

This invention relates to an audio mixing console used in recording studios or the like, capable of utilizing its operators for multiple functions in order to simplify the construction and facilitate the operation.

A mixing console is a device which, in recording studios, adjusts levels, equalizes frequencies of line inputs delivered from plural channels, and imparts them with such effects as reverberation.

In a prior art mixing console, different functions are performed by different operators, i.e., each operator is assigned with a single function. For example, level adjustment is made by operating a fader operator, frequency equalizing by an equalizing setting operator, and effects imparting by an effect imparting setting operator.

The prior art mixing console in which each operator is assigned a single function is disadvantageous because it must have a large number of operators resulting in a large mixing console and some of the operators are located far from a operating person thereby causing difficult operation.

Accordingly, an object of the present invention is to provide a mixing console whose size is minimized and which can be operated easily with simplified construction by enabling each of its operators to be used for various functions.

SUMMARY OF THE INVENTION

The audio mixing console achieving the above described object of the invention comprises, operators which can be driven both manually and by a motor, function selection means for selecting one of a fader function and other functions in respective channels as a function to be designated by each of said operators, function display means for displaying contents of operation assigned to said operators in accordance with selection by said function selection means, memory means for storing operation positions of said operators for each of said functions, control means for reading out operation position information stored in said memory means with respect to the function selected by said function selection means and positioning said operators to said position by motor driving, and signal processing means for applying signal processing to an input signal corresponding to the position of said operators with respect to the function selected by said function selection means.

According to the present invention, when a function has been selected by the function selection means, the operation position information stored in the memory means is read out, operators are initially positioned in the positions by the motor driving, and thereafter positions of the operators can be changed freely by manual operation. Signal processing is conducted by the signal processing means in correspondence to the positions of the operators with respect to the function selected.

According to the present invention, since the operators can be used also for functions other than the fader function, the construction of the mixing console can be simplified, and accordingly, the size of the mixing console can be minimized and operation can be facilitated.

BRIEF DESCRIPTION OF THE DRAWINGS

In the accompanying drawings,

FIGS. 3–6 are diagrams showing examples of display by a display 34 in respective functions;

DESCRIPTION OF A PREFERRED EMBODIMENT

A preferred embodiment of the invention will now be described with reference to the accompanying drawings.

In this embodiment of the invention, a fader function (level adjusting function) as well as other functions including frequency equalizing parameter setting, effect parameter setting and parameter setting on respective channel module are realized using fader operators.

Figure 2:
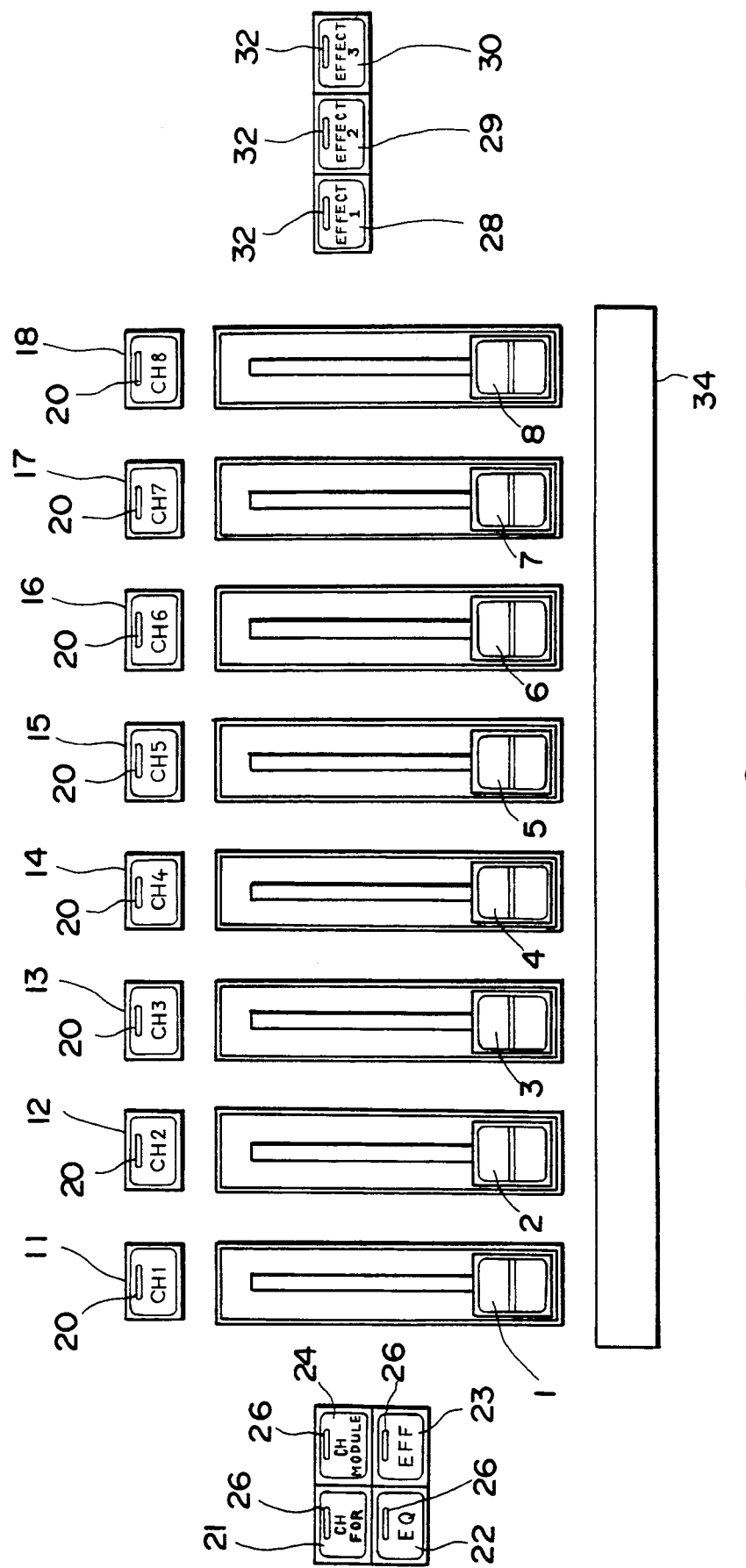
FIG. 2 is a plan view showing an example of construction of the operation table of the mixing console according to the invention.

An example of arrangement of operators on the mixing console is shown in FIG. 2. Fader operators 1–8 are respectively operated by manual operation or motor driving, and produce a position detection signal in correspondence with its slide position.

Above the operators 1–8, channel selection switches 11–18 are arranged. These channel selection switches 11–18 are used for setting of frequency equalizing parameter and selection of a channel in parameter setting on each channel module. In each of the channel selection switches 11–18, an LED 20 for indicating that the particular switch has been selected is provided.

On the left hand of the fader operators 1–8, function selection switches 21–24 are arranged. The switch 21 is a switch for selecting the fader function, the switch 22 for selecting the frequency equalizing function, the switch 23 for selecting the effect imparting function and the switch 24 for selecting the channel module, respectively. LEDs 26 are provided above the switches 21–24 for indicating the particular switch has been selected.

On the right hand of the fader operators 1–8, effect switches 28–30 for selecting kind of effect in the effect imparting function are arranged. As the effect, a reverberation effect and a chorus effect, for example, can be selected. On each switches 28–30, an LED 32 is provided for indicating that the particular switch has been selected.

Below the fader switches 1–8 is provided, a display 34 using LCDs and the like. Here, names of parameters given to the respective fader operators 1–8 according to the function selected by the function selection switches 21–24 are indicated in the positions of the respective operators 1–8. More specifically, when the fader function has been selected, as shown in FIG. 3, names of channels CH1–CH8 and name of the input source are indicated.

When the frequency equalizing function has been selected, names of frequency equalizing parameters are indicated as shown in FIG. 4 with regard to the channel selected by the channel selection switches 11-18. In FIG. 4, Lo represents low frequencies, Md represents middle frequencies, Hi represents high frequencies, F represents frequency, G represents gain, and Q represents Q of a resonance circuit. When the kinds of the parameters exceeds the number of operators, one operator is used for plural kinds of parameters, by changing the ratio of kinds of parameters for the fader operators 1-8 by scrolling.

When the effect imparting function has been selected, parameters with regard to the kind of effect selected by the switch 28 is displayed on a display 34 as shown in FIG. 5. The example in FIG. 5 shows a case where the reverberation imparting function has been selected, where RT represents reverberation time, ID represents initial delay, Hi represents high damp, and Type represents a sound field type such as a hall type, a stadium type, etc..

When the channel module function has been selected, parameters of the channel module are displayed on the display 34 with regard to the channel selected by the channel selection switches 11-18 as shown in FIG. 6. ATT represents an input attenuator, F, G and Q represent frequencies of the frequency equalizing, Send 1 and Send 2 represent volume of the Send 1 and Send 2, Pan represents left/right balance, Fader represents the fader. In this case, the frequency equalizing can be set by the frequency equalizing function of the frequency equalizing in FIG. 4. It is also possible to set fader of each channel simultaneously by the fader function of FIG. 3.

Figure 1:
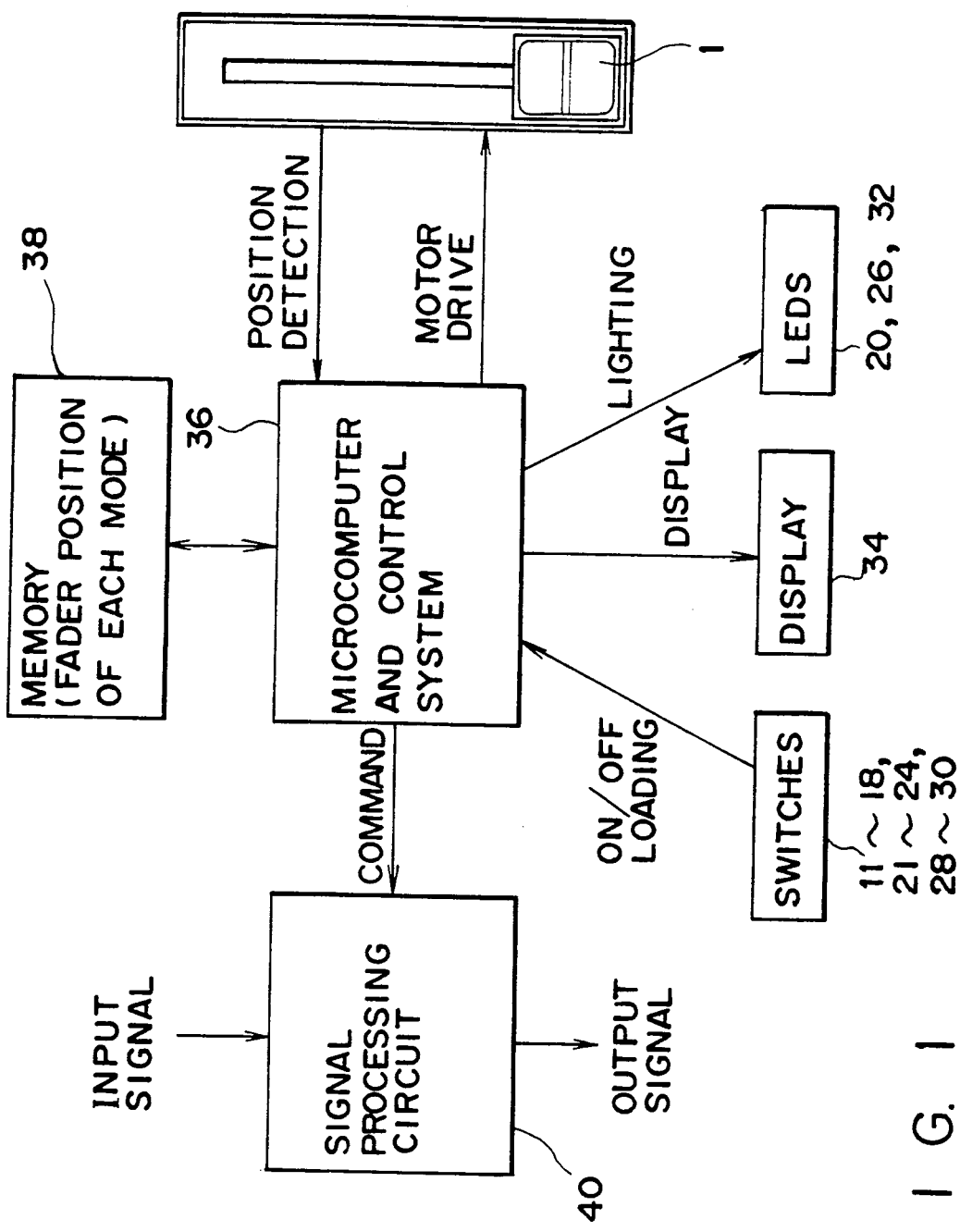
FIG. 1 is a block diagram of an embodiment of the invention showing construction of the control unit inside a mixing console with an operation table shown in FIG. 2.

FIG. 1 shows an example of the construction of the control unit in the mixing console which has the operation table shown in FIG. 2. Operation position detection information of the respective fader operators 1-8 and on/off information of the respective switches 11-18, 21-24 and 28-30 are input in a microcomputer and control system 36. The microcomputer and control system 36 controls the selectively operated switches to be lighted by the LEDs 20, 26 and 32. The microcomputer and control system 36 also causes the parameter assigned to the respective fader operators 1-8 with respect to the selected function to be displayed on the positions of these fader operators 1-8 on the display 34.

In the memory 38, position information of last operation of each fader operator before being switched to another function is registered.

A signal processing circuit 40 applies signal processing to an input signal according to the positions of the fader operators 1-8 with respect to the selected function and delivers out the processed signal.

According to the construction in FIG. 1, when the channel and the function have been selected at the respective switch 11-18, 21-24 and 28-30, the last parameters with respect to the function and channel are read from the memory 38 and the fader operators 1-8 are motor driven to the corresponding positions. Then corresponding LEDs of LEDs 20, 26, 32 are lighted and the parameters of the selected function are indicated on the display 34. By looking at the indication of the display 34, an operating person can set a desired parameter in a desired value by manual operation of the fader operators 1-8. When the function or the channel is switched by operation of some of the switches 11-18, 21-24 and 28-30, values of the last parameters are recorded in the memory 38.

Figure 7:
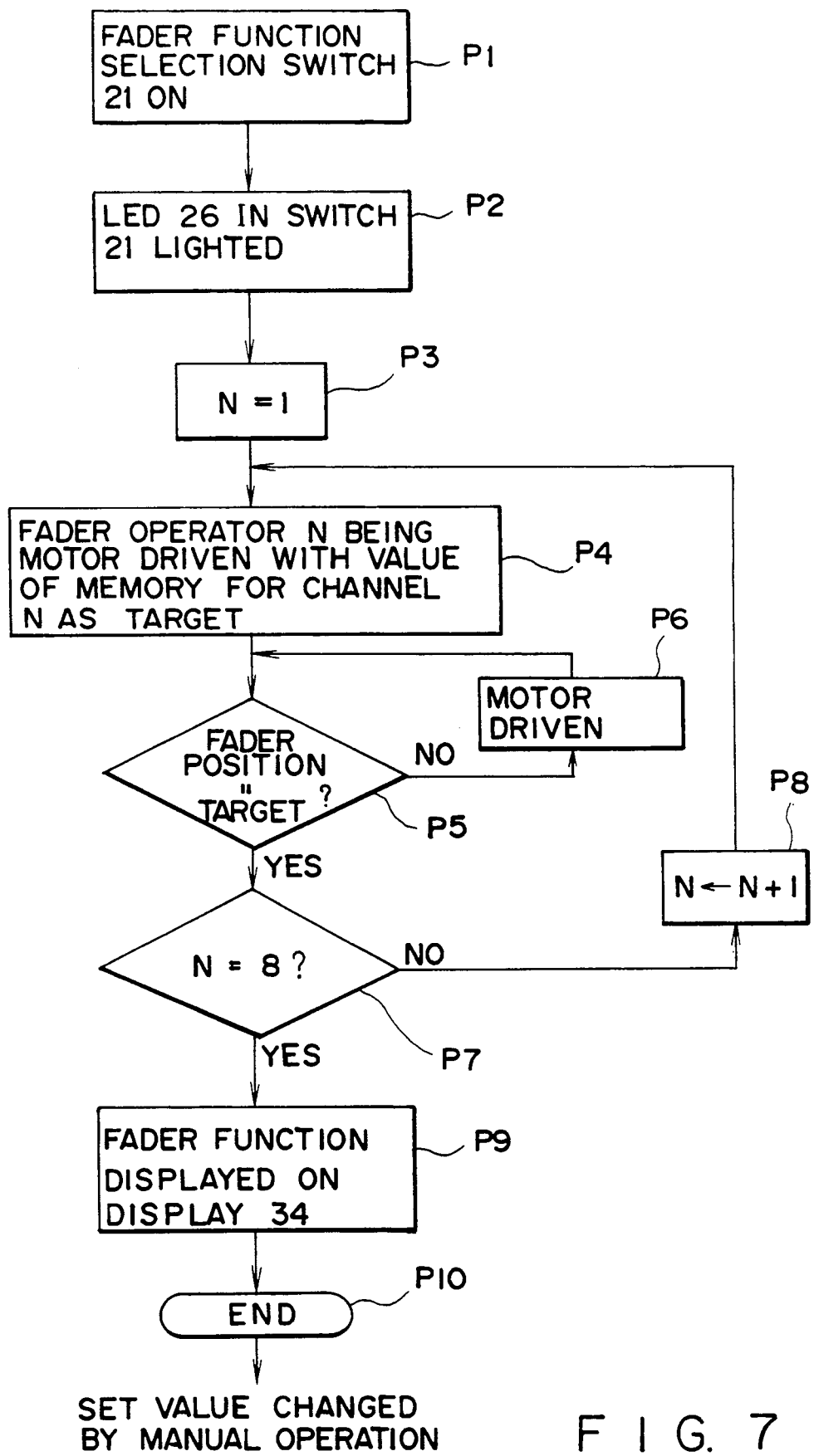
FIG. 7 is a flow chart of the control according to the construction of the control unit in FIG. 1, in the fader function mode.

An actual example of control according to the construction of FIG. 1 will now be described. FIG. 7 shows an example of the fader function. When the fader function selection switch 21 is turned on (P1), the LED 26 in the switch 21 is lighted (P2). Then the last operation position information of the respective fader operators 1-8 with respect to the fader function is read from the memory 38, and the fader operators 1-8 are motor driven to the corresponding positions (P3-P8). When all the fader operators 1-8 have been positioned, names of channel and input source are displayed on the display 34, as shown in FIG. 3 (P9). Now the initial setting is completed (P10) and thereafter the amount of fading of the respective channels can be adjusted by manual operation.

In the fader function mode, the fader function is not affected by operation of the channel selection switches 11-18 and the effect switches 28-30.

Figure 8:
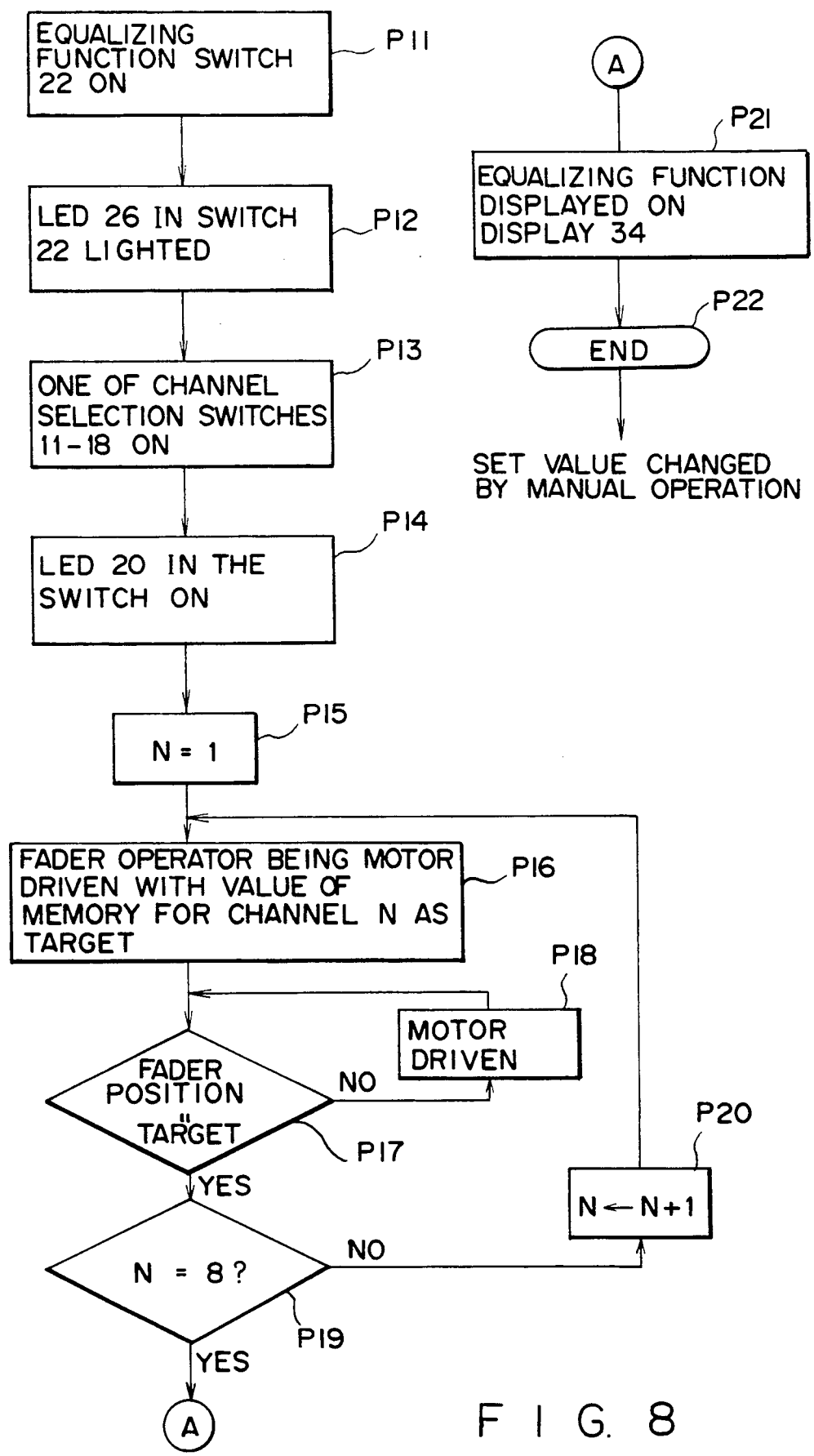
FIG. 8 is a flow chart according to the construction of the control unit in FIG. 1 in the frequency equalizing mode.

FIG. 8 shows an example of the frequency equalizing function. When the frequency equalizing switch 22 is turned on (P11), the LED 26 in the switch 22 is lighted (P12). Subsequently, when a desired one of the channel selection switches 11-18 has been turned on (P13), the LED 20 of this switch is lighted (P14). Position information of the last operation of the fader operators 1-8 with respect to the frequency qualizing function in the selected channel is read from the memory 38 and the fader operators 1-8 are motor driven to corresponding positions (P15-P20). Upon completing positioning of all fader operators 1-8, names of parameters of the frequency equalizing are displayed on the display 34 as shown in FIG. 4 (P21). The initial setting is thereby completed (P22) and the set values can be changed by subsequent manual operation. If another channel is selected by the channel selection switches 11 -18, the last values of the frequency equalizing parameters with respect to this channel are read from the memory 38 and the positions of the fader operators 1-8 are initially set and, in the same manner as described above, the set values can be manually changed thereafter (the last values immediately before switching are stored in the memory 38).

In the frequency equalizing function mode, operation of the effect switches 28-30 is ignored.

Likewise, in the effect imparting function and the channel module function, position information of last operation of is read from the memory 38 in accordance with selection by the function selection switches 23 and 24, effect switches 28-30 (in the case of the effect imparting function) and the channel selection switches 11-18 ( in the case of the channel module function) and the positions of the fader operators 1-8 are initially set. The contents of display shown in FIGS. 5 and 6 are displayed on the display 34 and the parameters can be changed by manual operation thereafter.

In a case where the number of parameters is smaller than the number of the fader operators, an empty fader operator is initially set to 0 position and, even if this fader operator is manually operated, the fader operator is compulsorily restored to the 0 position when the operating person has released his finger from the fader operator. In the case of the effect imparting function, operation of the channel selection switches 11-18 is ignored and, in the case of the channel module function, operation of the effect switches 20-30 is ignored.

What is claimed is:

1. A mixing console comprising:
   operators which can be driven both manually and by motors;

function selection means for selecting one of a fader function or other functions in respective channels as a function to be assigned to each of said operators;

function display means for displaying information corresponding to the operation assigned to said operators in accordance with selection by said function selection means;

memory means for storing operation positions of said operators for each of said functions;

control means for reading out operation position information stored in said memory means with respect to the function selected by said function selection means and positioning said operators to said position by motor driving; and signal processing means for applying to an input signal signal processing corresponding to the position of said operators with respect to the function selected by said function selection means.

2. A mixing console as defined in claim 1 wherein the other functions selected by said function selection means comprises at least one of equalizer parameter setting function, effect parameter setting function, and parameter setting function of each channel module for each channel.

* * * * *